United States Patent
Lee et al.

(10) Patent No.: US 8,432,741 B2
(45) Date of Patent: *Apr. 30, 2013

(54) NONVOLATILE MEMORY DEVICE AND NONVOLATILE MEMORY SYSTEM EMPLOYING SAME

(75) Inventors: Seung-Jae Lee, Hwaseong-si (KR); Dae-Seok Byeon, Seongnam-si (KR); Hyun-Chul Ha, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 13/419,732

(22) Filed: Mar. 14, 2012

(65) Prior Publication Data

US 2012/0170370 A1    Jul. 5, 2012

Related U.S. Application Data

(63) Continuation of application No. 12/868,022, filed on Aug. 25, 2010, now Pat. No. 8,154,927.

(30) Foreign Application Priority Data

Sep. 28, 2009    (KR) .................. 10-2009-0091435

(51) Int. Cl.
*G11C 11/34*    (2006.01)
*G11C 16/04*    (2006.01)
*G11C 16/06*    (2006.01)

(52) U.S. Cl.
USPC .............. 365/185.2; 365/185.02; 365/185.17; 365/185.18; 365/185.24

(58) Field of Classification Search ............. 365/185.02, 365/185.2, 185.17, 185.18, 185.24
See application file for complete search history.

(56) References Cited

U.S. PATENT DOCUMENTS

| | | | |
|---|---|---|---|
| 7,272,049 | B2 | 9/2007 | Kang et al. |
| 8,154,927 | B2* | 4/2012 | Lee et al. .................. 365/185.2 |
| 2009/0046505 | A1 | 2/2009 | Lee et al. |
| 2009/0168526 | A1 | 7/2009 | Kang |
| 2009/0238003 | A1 | 9/2009 | Namiki et al. |
| 2011/0090738 | A1 | 4/2011 | Park et al. |
| 2011/0222340 | A1 | 9/2011 | Lee et al. |

FOREIGN PATENT DOCUMENTS

| | | |
|---|---|---|
| JP | 2008052808 A | 3/2008 |
| KR | 1020070029299 A | 3/2007 |
| KR | 1020080085409 A | 9/2008 |

* cited by examiner

*Primary Examiner* — Ly D Pham
(74) *Attorney, Agent, or Firm* — Volentine & Whitt, PLLC

(57) ABSTRACT

A nonvolatile memory device comprises a memory cell array, a row selection circuit and a voltage generator. The memory cell array comprises a first dummy memory cell, a second dummy memory cell, and a NAND string comprising a plurality of memory cells coupled in series between a string selection transistor and a ground selection transistor through the first dummy memory cell and the second dummy memory cell. During a read-out operation mode, a dummy read-out voltage is applied to a first dummy wordline coupled to the first dummy memory cell, and to a second dummy wordline coupled to the second dummy memory cell. The dummy read-out voltage has a lower magnitude than a read-out voltage applied to an unselected memory cell during the read-out operation mode.

19 Claims, 8 Drawing Sheets

NONVOLATILE MEMORY DEVICE AND NONVOLATILE MEMORY SYSTEM EMPLOYING SAME

CROSS-REFERENCE TO RELATED APPLICATIONS

This application is a Continuation Application of application Ser. No. 12/868,022, filed Aug. 25, 2010, which claims priority under 35 USC §119 to Korean Patent Application No. 10-2009-0091435 filed on Sep. 28, 2009, the disclosure of which is hereby incorporated by reference in its entirety.

BACKGROUND

Embodiments of the inventive concept relate generally to memory technologies. More particularly, embodiments of the inventive concept relate to nonvolatile memory devices and nonvolatile memory systems.

Memory devices can be broadly classified into two groups based on whether they retain stored data when disconnected from power. These groups include volatile memory devices, which lose stored data when disconnected from power, and nonvolatile memory devices, which retain stored data when disconnected from power.

Examples of volatile memory devices include dynamic random access memory (DRAM), and static random access memory (SRAM), and examples of nonvolatile memory devices include electrically erasable and programmable read only memory (EEPROM), phase-change random access memory (PRAM), resistance random access memory (RRAM), and magnetic random access memory (MRAM).

EEPROM is one of the more common forms of nonvolatile memory in use today due to its ability to be efficiently programmed, read, and erased. Flash EEPROM (hereafter, "flash memory"), for instance, can be found in a wide range of modern electronic devices, including solid state drives, mobile phones, digital cameras, and many others.

Flash memory devices have different operating modes for performing program, read, and erase operations. These modes will be referred to as a program operation mode, a read-out operation mode, and an erase mode. The program and read-out operation modes typically operate on relatively small units of data, such as words or pages. In other words, data is typically programmed or read out in page or word units. The erase operation mode, on the other hand, typically operates on entire memory blocks, which comprise multiple pages. In other words, data is typically erased an entire memory block at a time.

Flash memory devices can be designed with various alternative memory cell array configurations according to different applications. The most common configurations are found in NAND-type flash memory devices, in which cell transistors are connected in series between a bitline and a ground line, and in NOR-type flash memory devices, in which cell transistors are connected in parallel.

In a flash memory device, memory cells often undergo several read-out operations while storing the same data. These repeated read-out operations can unintentionally change the stored data through a phenomenon referred to as soft programming. In soft programming, a relatively low voltage used to select the memory cells causes an unintended shift in the memory cells' respective threshold voltages. This shift, accumulated over many read operations, can lead to undesired changes in the stored data, referred to as a read-out disturbance. Moreover, the effects of soft programming become more significant as the features in a flash memory device become smaller and more densely integrated.

SUMMARY

Selected embodiments of the inventive concept provide nonvolatile memory devices and nonvolatile memory systems capable of improving the performance of read-out operations.

According to an embodiment of the inventive concept, a nonvolatile memory device comprises a memory cell array, a row selection circuit, and a voltage generator. The memory cell array comprises a first dummy memory cell connected to a first dummy wordline, a second dummy memory cell connected to a second dummy wordline, a NAND string comprising a plurality of memory cells connected in series between a string selection transistor and a ground selection transistor through the first dummy memory cell and the second dummy memory cell, a plurality of wordlines connected to the plurality of memory cells, a string selection line connected to the string selection transistor, and a ground selection line connected to the ground selection transistor. The row selection circuit is coupled to the memory cell array through the string selection line, the ground selection line and the plurality of wordlines, and configured to provide wordline voltages to the plurality of wordlines based on an address signal. The voltage generator is configured to generate the wordline voltages. During a read-out operation mode of the nonvolatile memory device, a first dummy read-out voltage is applied to the first dummy wordline, a second dummy read-out voltage is applied to the second dummy wordline, and a read-out voltage is applied to unselected wordlines connected to unselected memory cells in the NAND string, the first and second dummy read-out voltages having respective first and second voltage levels and the read-out voltage having a third voltage level greater than the first and second voltage levels.

In certain embodiments, the first or second voltage level is a voltage level capable of reducing floating gate coupling on a wordline adjacent to the first or second dummy wordline due to a shift in a threshold voltage of the first or second dummy memory cell.

In certain embodiments, the first or second voltage level is within a range of about 7 to 7.5 volts and the third voltage level is within a range of about 5 to 6 volts.

In certain embodiments, the threshold voltage of the first or second dummy memory cell is lower than the first or second dummy read-out voltage.

In certain embodiments, the first voltage level is substantially the same as the second voltage level.

In certain embodiments, the first voltage level is different from the second voltage level.

In certain embodiments, the read-out voltage is applied to the string selection line and the ground selection line during the read-out operation mode.

In certain embodiments, each of the wordline voltages has a level corresponding to a program voltage, a program pass voltage, the read-out voltage, or the first or second dummy read-out voltage.

In certain embodiments, a selection voltage that is lower than the read-out voltage is applied to a selected wordline connected to a selected memory cell to be read-out during the read-out operation mode.

In certain embodiments, the first and second dummy read-out voltages are higher than the selection voltage.

In certain embodiments, the first and second dummy read-out voltages are lower than the selection voltage.

In certain embodiments, the first and second dummy memory cells are in an erased state before the first and second dummy read-out voltages are provided to the first and second dummy wordlines.

According to another embodiment of the inventive concept, a system comprises a nonvolatile memory device and a memory controller. The memory controller is configured to control the nonvolatile memory device. The nonvolatile memory device comprises a memory cell array, a row selection circuit, and a voltage generator. The memory cell array comprises a first dummy memory cell connected to a first dummy wordline, a second dummy memory cell connected to a second dummy wordline, a NAND string comprising a plurality of memory cells connected in series between a string selection transistor and a ground selection transistor through the first dummy memory cell and the second dummy memory cell, a plurality of wordlines connected to the plurality of memory cells, a string selection line connected to the string selection transistor, and a ground selection line connected to the ground selection transistor. The row selection circuit is coupled to the memory cell array through the string selection line, the ground selection line and the plurality of wordlines, and configured to provide wordline voltages to the plurality of wordlines based on an address signal. The voltage generator is configured to generate the wordline voltages. During a read-out operation mode of the nonvolatile memory device, a first dummy read-out voltage is applied to the first dummy wordline, a second dummy read-out voltage is applied to the second dummy wordline, and a read-out voltage is applied to unselected wordlines connected to unselected memory cells in the NAND string, the first and second dummy read-out voltages having respective first and second voltage levels and the read-out voltage having a third voltage level greater than the first and second voltage levels.

In certain embodiments, the nonvolatile memory device is a flash memory device.

In certain embodiments, the system further comprises a host apparatus incorporating the nonvolatile memory device and the memory controller. In certain embodiments, the host is a portable electronic device.

According to still another embodiment of the inventive concept, a nonvolatile memory device comprises a memory cell array, a plurality of wordlines, a first dummy wordline, a second dummy wordline, and a row decoder. The memory cell array comprises a plurality of NAND strings each comprising a plurality of nonvolatile memory cells connected in series between a first dummy memory cell and a second dummy memory cell. The wordlines are respectively connected to the plurality of nonvolatile memory cells. The first dummy wordline is connected to the first dummy memory cell of each of the NAND strings. The second dummy wordline is connected to the second dummy memory cell of each of the NAND strings. The row decoder is configured to operate during a read operation to apply a read voltage to wordlines connected to memory cells that are not selected in the read operation, and to apply first and second dummy read voltages to the respective first and second dummy memory cells, wherein the first and second dummy read voltages are both lower than the read voltage.

In certain embodiments, the first dummy read voltage is lower than the second dummy read voltage.

In certain embodiments, at least a subset of the plurality of memory cells comprises multi-level flash memory cells.

In certain embodiments, the read voltage is within a range of about 5 to 6 volts, and the first or second dummy read voltage is within a range of about 7 to 7.5.

BRIEF DESCRIPTION OF THE DRAWINGS

The drawings illustrate selected embodiments of the inventive concept. In the drawings, like reference numbers indicate like features.

DETAILED DESCRIPTION OF THE EMBODIMENTS

Selected embodiments of the inventive concept are described below with reference to the accompanying drawings. These embodiments are presented as teaching examples and should not be construed to limit the scope of the inventive concept.

In the description that follows, the terms first, second, third etc. are used to describe various elements, but these elements should not be limited by these terms. Rather, these terms are used to distinguish one element from another. Thus, a first element discussed below could be termed a second element without departing from the teachings of the inventive concept. As used herein, the term "and/or" includes any and all combinations of one or more of the associated listed items.

Where an element is referred to as being "connected" or "coupled" to another element, it can be directly connected or coupled to the other element or intervening elements may be present. In contrast, where an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
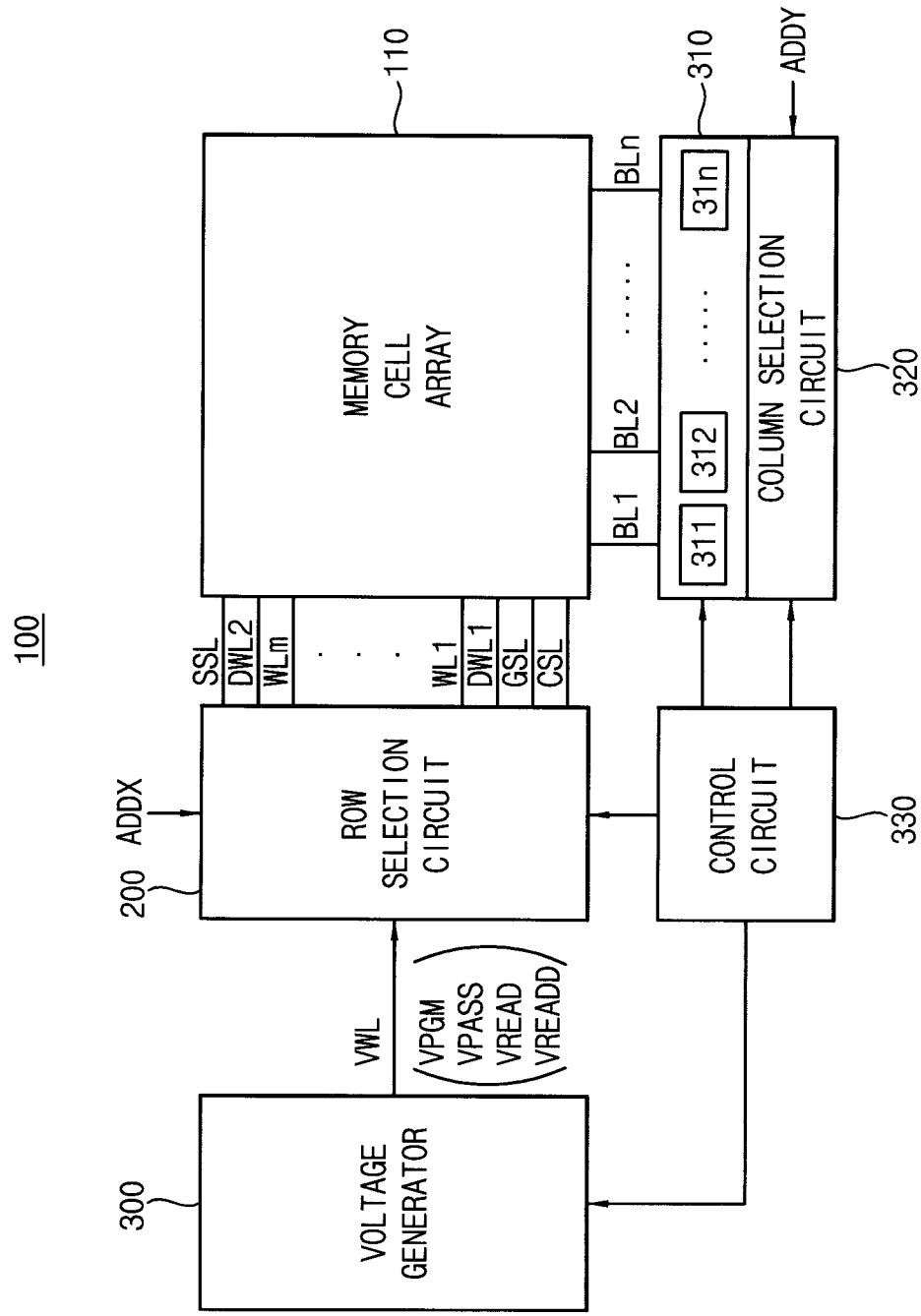
FIG. 1 is a block diagram illustrating a nonvolatile memory device according to an embodiment of the inventive concept.
Figure 2A:
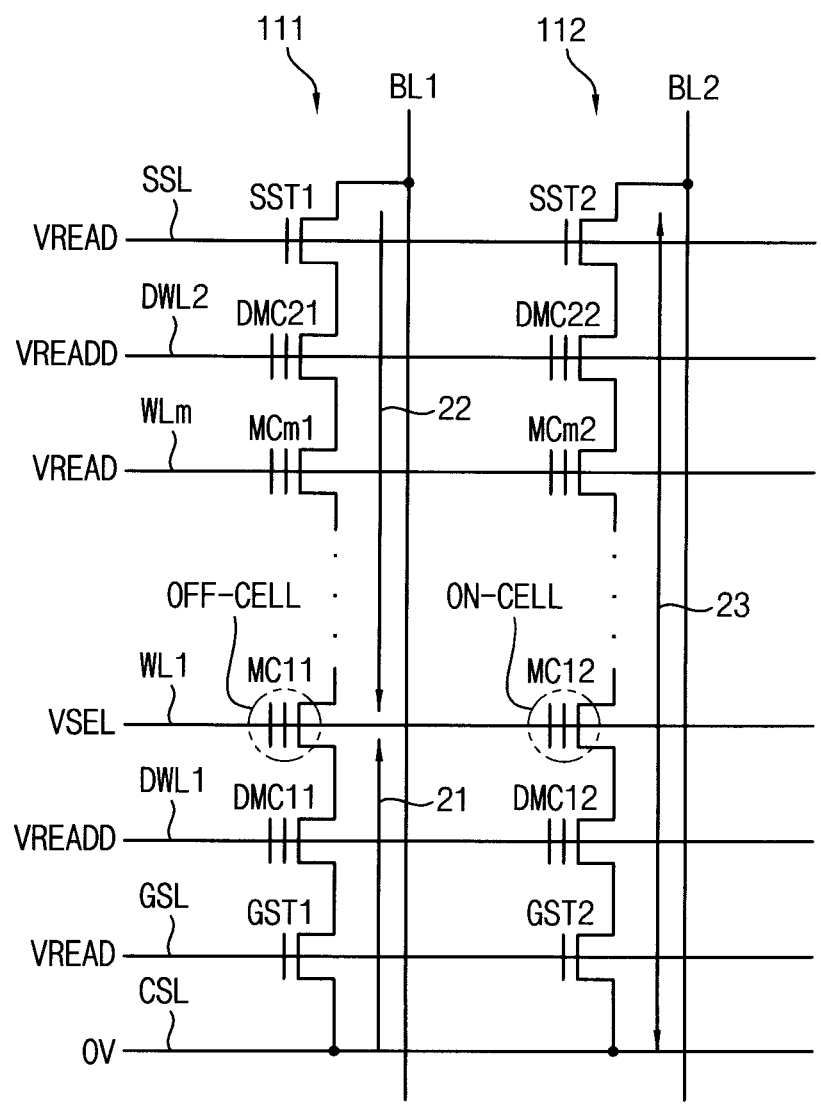
FIGS. 2A and 2B are circuit diagrams illustrating examples of NAND strings in the nonvolatile memory device of FIG. 1.
Figure 2B:
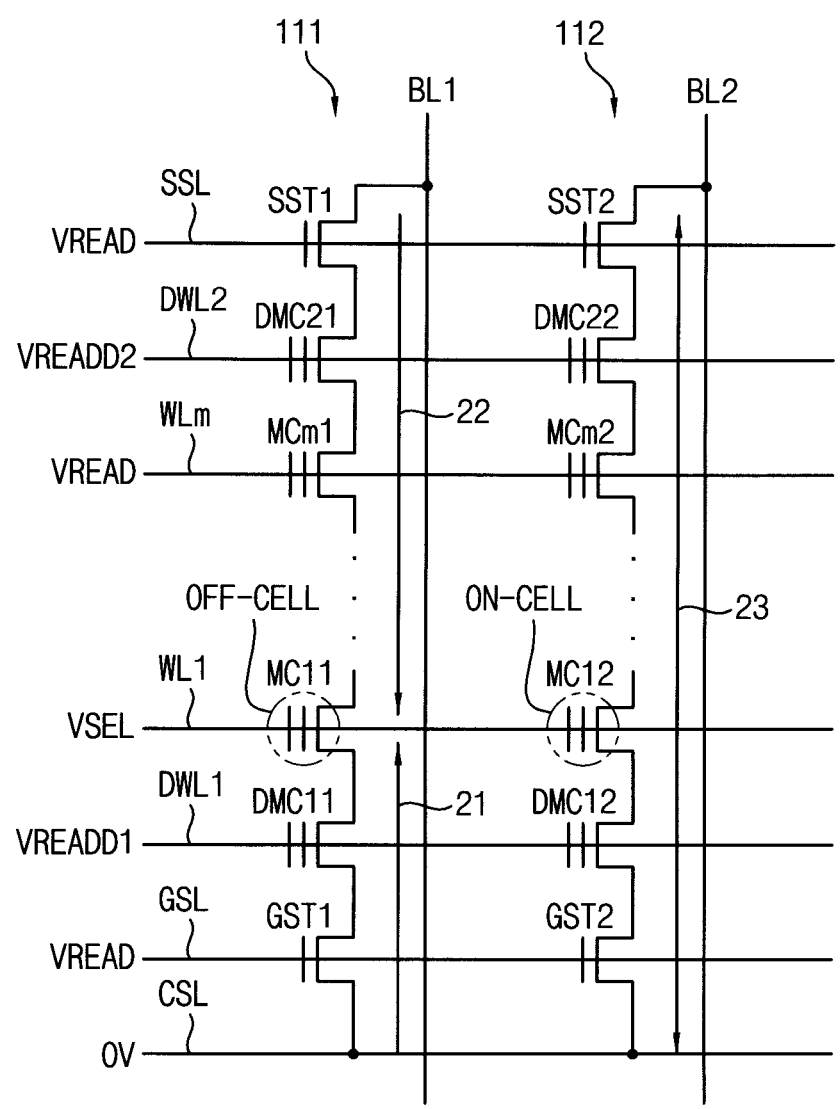

FIG. 1 is a block diagram illustrating a nonvolatile memory device 100 according to an embodiment of the inventive concept, and FIGS. 2A and 2B are circuit diagrams illustrating examples of NAND strings in nonvolatile memory device 100. For explanation purposes, it will be assumed that nonvolatile memory device 100 comprises a NAND flash memory device. However, the inventive concept is not limited to flash memory devices.

For convenience of illustration, FIGS. 2A and 2B show only two of "n" NAND strings in a nonvolatile memory device 100. The other NAND strings have a function and structure similar to those of the illustrated NAND strings.

Referring FIGS. 1 and 2A, nonvolatile memory device 100 comprises a memory cell array 110, a row selection circuit 200, a voltage generator 300, a page buffer block 310, a column selection circuit 320 and a control circuit 330.

Memory cell array 110 comprises a plurality of NAND strings 111, 112 that extend in a column direction. NAND string 111 comprises a first dummy cell DMC11, a second dummy cell DMC21, a string selection transistor SST1, a ground selection transistor GST1, and a plurality of memory cells MC11 through MCm1. Memory cells MC11 through MCm1 are coupled in series between string selection transistor SST1 and ground selection transistor GST1 through first dummy memory cell DMC11 and second dummy memory cell DMC21. NAND string 112 comprises a first dummy cell DMC12, a second dummy cell DMC22, a string selection transistor SST2, a ground selection transistor GST2, and a plurality of memory cells MC12 through MCm2. Memory cells MC12 through MCm2 are coupled in series between string selection transistor SST2 and ground selection transistor GST2 through first dummy memory cell DMC12 and second dummy memory cell DMC22.

Memory cells in different NAND strings are coupled in common to wordlines WL1 through WLm. First dummy memory cells DMC11 and DMC12 are coupled in common to a dummy wordline DWL1, and second dummy memory cells DMC21 and DMC22 are coupled in common to a dummy wordline DWL2. Drains of string selection transistors SST1 and SST2 are coupled to bitlines BL1 to BL2, respectively, and sources of ground selection transistors GST1 and GST2 are coupled to a common source line CSL. In this example, the layout size of dummy memory cells DMC in each string is substantially same as the layout size of memory cells MC1 through MCm in each string.

Row selection circuit 200 is coupled to memory cell array 110 through a string selection line SSL, a ground selection line GSL, wordlines WL1 through WLm, dummy wordlines DWL1 and DWL 2. Row selection circuit 200 provides a wordline voltage VWL to wordlines WL1 through WLm and dummy wordlines DWL1 and DWL2 based on a row address signal ADDX, according to different operation modes, such as a read-out operation mode and a program operation mode. Wordline voltage VWL can assume different values corresponding to a program voltage VPGM, a program pass voltage VPASS, a read-out voltage VREAD, and a dummy read-out voltage VREADD. Voltage generator 300 generates wordline voltage VWL by transforming a power supply voltage. Voltage generator 300 typically comprises a charge pump.

Page buffer block 310 comprises a plurality of page buffers 311 through 31n coupled in parallel between bitlines BL through BLn and column selection circuit 320. Page buffers 311 through 31n are configured to operate as sense amplifiers or write drivers depending on an operating mode of nonvolatile memory device 100. For example, page buffers 311 through 31n operate as sense amplifiers during the read-out operation mode and as write drivers during the program operation mode. Column selection circuit 320 selects a bitline coupled to a memory cell that contains a data to be read or programmed in response to column address signal ADDY. Such read-out or program operations of nonvolatile memory device 100 are controlled by control circuit 330.

Read-out operations of NAND-type semiconductor memory devices are typically performed on a page basis, and stored data is typically detected and read into a page buffer that senses bitline voltages. The detected data is stored in latches of the page buffers, and then output in sequence through a data line. In the read-out operations, memory cells are identified as on-cells (or erased cells) or off-cells (or a programmed cell) based on whether current flows through the memory cells when a read voltage is applied to their respective gates. The off-cells have threshold voltages that are higher than the read voltage due to electrons that have been injected into their respective floating gates, and on-cells have threshold voltages that are lower than the read voltage due to a lower amount of electrons on their respective floating gates.

In the examples of FIGS. 2A and 2B, a read-out memory cell MC11, which is coupled to a selected wordline WL1, is a programmed memory cell (or off-cell) and a memory cell MC12, which is coupled to selected wordline WL1, is an un-programmed memory cell (or on-cell). First dummy memory cells DMC11 and DMC12, which are coupled to first dummy wordline DWL1, receive program pass voltage VPASS during the program operation mode, and constitute un-programmed cells, or on-cells. Second dummy memory cells DMC21 and DMC22, which are coupled to second dummy wordline DWL2, also receive program pass voltage VPASS during the program operation mode, and constitute un-programmed cells, or on-cells.

Selected wordline WL1, which is coupled to memory cells MC11 and MC 12, receives a selection voltage VSEL to read memory cells MC11 and MC12. Selection voltage VSEL typically has a value in a range of about 0V to 5V. Wordlines WL2 through WLm that are not selected receive read-out voltage VREAD with a value in a range of about 7 to 7.5V. This range, however, is merely an example, and read-out voltage VREAD is not limited to values within this range.

Selection string line SSL and ground selection line GSL receive read-out voltage VREAD and dummy wordlines DWL1 and DWL2 receive dummy read-out voltage VREADD, which has a lower voltage level than read-out voltage VREAD (e.g., 5 to 6V). The relatively high voltage level of read-out voltage VREAD allows selection string line SSL and ground selection line GSL to turn on associated string selection transistors and ground selection transistors to avoid restricting current through a selected NAND string. The lower voltage level of dummy read-out voltage VREADD can reduce or prevent floating gate coupling between dummy memory cells DMC11 and DMC12 and nearby elements, such as memory cells connected to wordlines WL1 and WLm. The above levels of dummy read-out voltage VREADD are presented as examples, and dummy read-out voltage VREADD could have different levels in various alternative embodiments. In certain embodiments, the level of dummy read-out voltage VREADD can be considerably higher than threshold voltages of dummy memory cells DMC11 and DMC12, but lower than read-out voltage VREAD. The threshold voltages of dummy memory cells DMC11 and DMC12 can also relatively small compared with the level of dummy read-out voltage VREADD.

Dummy memory cells typically do not store data. In other words, dummy memory cells generally remain in an erased state with relatively low threshold voltages. As a result, read-out disturbances (i.e., shifts of threshold voltages due to applied voltages) tend to occur more readily in dummy memory cells than in other memory cells. As read-out operations are repeated, the threshold voltages of the dummy memory cells shift in a positive direction because the dummy memory cells are soft programmed unintentionally as the read-out operations are repeatedly performed on the dummy memory cells to provide the read-out voltage to the dummy memory cell. The increase of the threshold voltages of the dummy memory cells can contribute to floating gate coupling on worldliness located near the dummy memory cells. Accordingly, to reduce or avoid this floating gate coupling, during the read-out operation mode, dummy wordlines DWL1 and DWL2 are provided with dummy read-out voltage VREADD that is lower than read-out voltage VREAD provided to unselected wordlines. Where dummy read-out voltage VREADD is provided to dummy wordlines DWL1 and DWL2, transistors in dummy memory cells DMC11, DMC12, DMC21 and DMC22 are turned on.

The example of FIG. 2B is similar to the example of FIG. 2A, except that in FIG. 2B, dummy wordlines DWL1 and DWL2 receive dummy read-out voltages VREADD1 and VREADD2 with different levels. For instance, dummy read-out voltage VREADD1 can be relatively higher than dummy read-out voltage VREADD2, or dummy read-out voltage VREADD2 can be relatively higher than dummy read-out voltage VREADD1. These different levels can be used to address different types or intensities of floating gate coupling in nearby elements.

Figure 3:
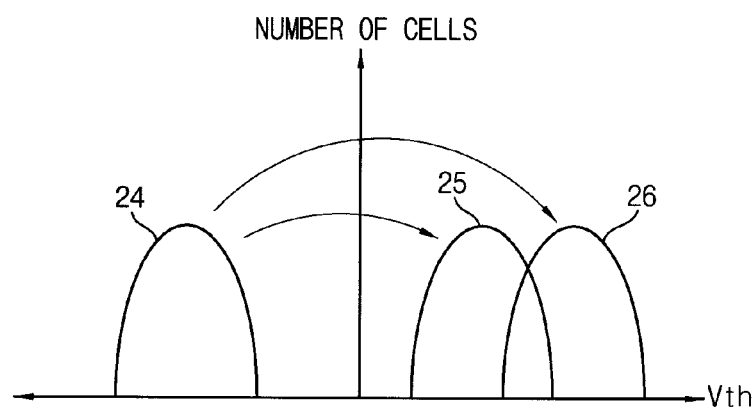
FIG. 3 is a diagram illustrating a shift in threshold voltages of dummy memory cells.

FIG. 3 is a diagram illustrating changes of threshold voltages in dummy memory cells such as those illustrated in FIGS. 2A and 2B.

Referring to FIG. 3, a reference numeral 24 indicates threshold voltages of dummy memory cells in nonvolatile memory device 100 in an erased state. A reference numeral 25 indicates threshold voltages of dummy memory cells in nonvolatile memory device 100 after repeatedly receiving dummy read-out voltage VREADD is repeatedly applied to dummy wordlines DWL1 and DWL2 in different read-out operations. A reference numeral 26 indicates threshold voltages of dummy memory cells in nonvolatile memory device 100 after read-out voltage VREAD is repeatedly applied to dummy wordlines DWL1 and DWL2 in different read-out operations. Because dummy read-out voltage VREADD is lower than read-out voltage VREAD, the threshold voltages of the dummy memory cells shifts less in response to dummy read-out voltage VREADD than in response to read-out voltage VREAD.

In a read-out operation of a selected memory cell such as memory cell MC11 of FIG. 2A, selection voltage VSEL is applied to a gate of the selected memory cell. Because memory cell MC11 is a programmed cell (or off-cell), it remains off even when selection voltage VSEL is applied to a gate thereof. Consequently, a voltage of a first path 21 between the read-out memory cell MC11 and common source line CSL is substantially equal to a voltage of common source line CSL (e.g., 0V), and a voltage of a second path 22 between memory cell MC11 and bitline BL1 is substantially equal to a bitline voltage VBL1. Paths 21 and 22 indicate conduction paths comprising drains, sources of cell transistors, and channels that are formed between the drains and the sources while voltages higher than threshold voltages are applied to gates of corresponding cell transistors.

Where selection voltage VSEL is applied to an erased cell (or on-cell) such as memory cell MC12 in a read-out operation, a channel is formed between a source and a drain of the read-out memory cell, and a transistor of erased memory cell MC12 is turned on such that a drain and a source of memory cell MC12 are electrically connected. Consequently, a voltage of a third path 23 between a bitline BL2 and common source line CSL is substantially equal to a voltage of common source line CSL, for example 0V.

Figure 4:
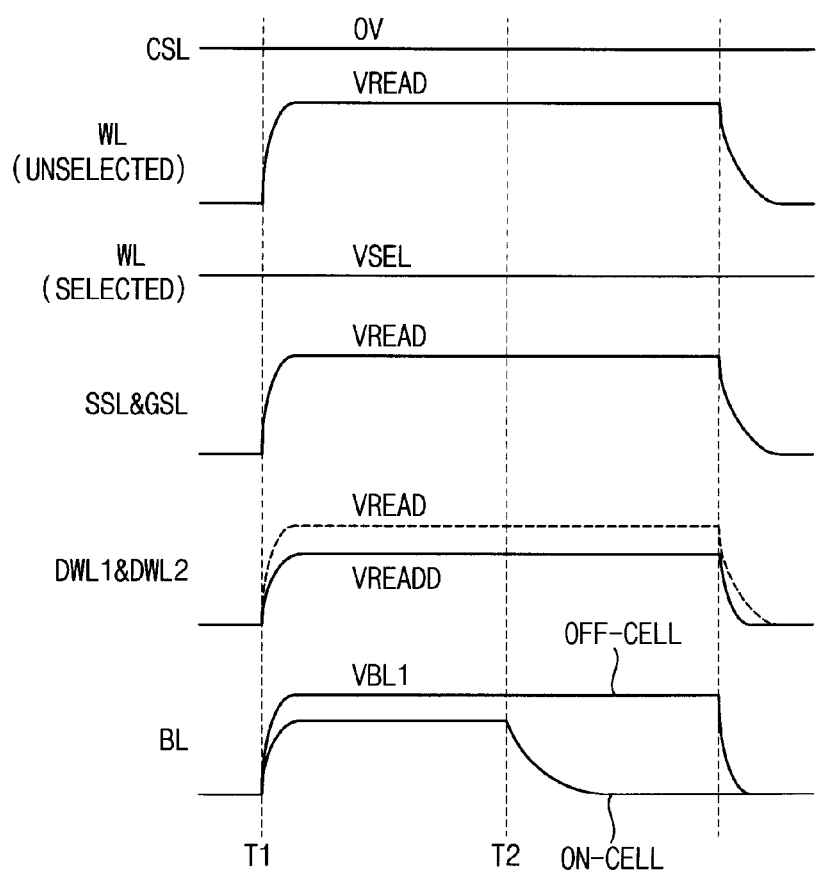
FIG. 4 is a waveform diagram illustrating a read-out operation of the nonvolatile memory device of FIG. 1.

FIG. 4 is a waveform diagram illustrating a read-out operation of the nonvolatile memory device of FIG. 1.

Referring to FIG. 4, common source line CSL receives a ground voltage of about 0V. At time T1, unselected wordlines receive read-out voltage VREAD of about 7 to 7.5V, and selected wordlines receive selection voltage VSEL of about 0 to 5V. Read-out voltage VREAD is also provided to string selection transistor SST and ground selection transistor GST through string selection line SSL and ground selection line GSL, respectively. First dummy wordline DWL1 and second dummy wordline DWL2 receive dummy read-out voltage VREADD of about 5 to 6V.

As illustrated in FIG. 4, a bitline BL coupled to an off-cell is driven to a bitline voltage VBL1, and another bitline BL coupled to an on-cell is driven to a voltage level that is relatively lower than bitline voltage VBL1. Where a sensing operation is being performed at T2, second path 22 and bitline BL coupled to the off-cell are maintained at a voltage level that is substantially equal to bitline voltage VBL1. Additionally, voltages of third path 23 and bitline BL coupled to the on-cell are decreased to the voltage level of common source line CSL, for example, 0V, because third path 23 is coupled electrically to common source line CSL through the on-cell as described with reference to FIG. 2A. Thus, data stored in the read-out memory cells is read by sensing voltage changes of corresponding bitline voltages.

In successive read-out operations, control gates of dummy memory cells DMC11, DMC12, DMC21 and DMC22 receive dummy read-out voltage VREADD, which has a lower level than read-out voltage VREAD, and thus floating gate coupling that may occur due to disturbances of threshold voltages can be reduced.

Although FIG. 4 illustrates an example where dummy wordlines DWL1 and DWL2 receive substantially same dummy read-out voltages VREADD (see FIG. 2A), dummy wordlines DWL1 and DWL2 can alternatively be provided with different dummy read-out voltages VREADD1 and VREAD2 (see FIG. 2B).

Although FIG. 4 illustrates an example where selection voltage VSEL is substantially equal to 0V, selection voltage VSEL can be higher than dummy read-out voltage VREADD where the read-out memory cells are multi-level cells for storing multi-bit data according to other embodiments.

Figure 5:
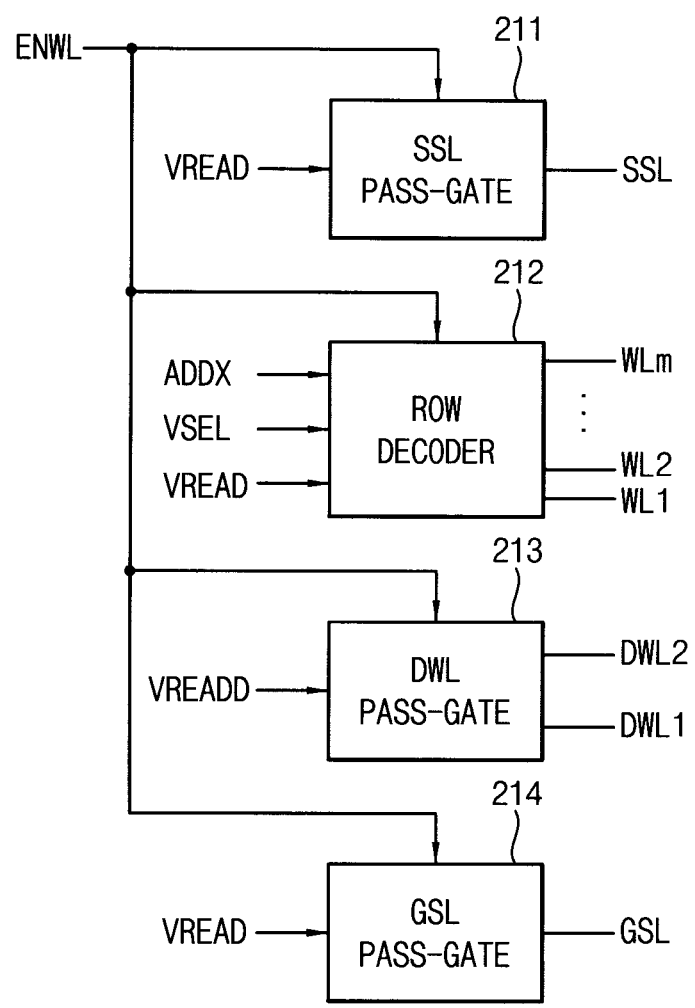
FIG. 5 is a block diagram illustrating an example of a row selection circuit of FIG. 1.

FIG. 5 is a block diagram illustrating an example of row selection circuit 200 of FIG. 1. In the example of FIG. 5, row selection circuit 200 comprises a string selection pass-gate 211, a row decoder 212, a dummy wordline pass-gate 213 and a ground selection pass-gate 214.

String selection pass-gate 211 and ground selection pass-gate 214 output read-out voltage VREAD in response to a wordline enable signal ENWL, to string selection line SSL and ground selection line GSL, respectively. Consequently, ground selection transistor GST, which has a gate coupled to ground selection line GSL, is turned on, and a corresponding NAND string is electrically coupled to common source line CSL. Additionally, string selection transistor SST, which has a gate coupled to string selection line SSL, is turned on, and NAND string is electrically coupled to bitline BL.

Row decoder 212 outputs selection voltage VSEL to selected wordlines and read-out voltage VREAD to unselected wordlines, in response to wordline enable signal ENWL and row address signal ADDX.

Dummy wordline pass-gate 213 outputs dummy wordline voltage VREADD to dummy wordlines DWL1 and DWL2 in response to wordline enable signal ENWL.

Wordline enable signal ENWL is a control signal for determining a time point when a voltage is applied to a wordline during the read-out operation mode, regardless of the name of the signal. Although dummy read-out voltage VREADD is provided by dummy wordline pass-gate 213 in the example of FIG. 5, dummy read-out voltage VREADD can alternatively be provided by row decoder 212.

Figure 6:
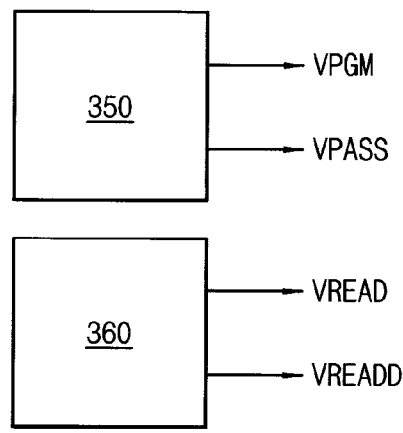
FIG. 6 is a block diagram illustrating an example of a voltage generator of FIG. 1.

FIG. 6 is a block diagram illustrating an example of voltage generator 300 of FIG. 1. In the example of FIG. 6, voltage generator 300 comprises a first voltage generating unit 350 and a second voltage generating unit 360.

First voltage generating unit 350 generates program voltage VPGM and program pass voltage VPASS. Second voltage generating unit 360 generates read-out voltage VREAD and dummy read-out voltage VREADD. During the program operation mode, program voltage VPGM is provided to selected wordlines and program pass voltage VPASS is provided to unselected wordlines and the dummy wordlines. During the read-out operation mode, dummy read-out voltage VREADD is provided to the dummy wordlines, selection voltage VSEL is provided to wordlines connected to selected memory cells to be read, and read-out voltage VREAD is provided to unselected wordlines, string selection line SSL and ground selection line GSL. In this example, selection voltage VSEL can be a ground voltage (e.g., 0V).

Figure 7:
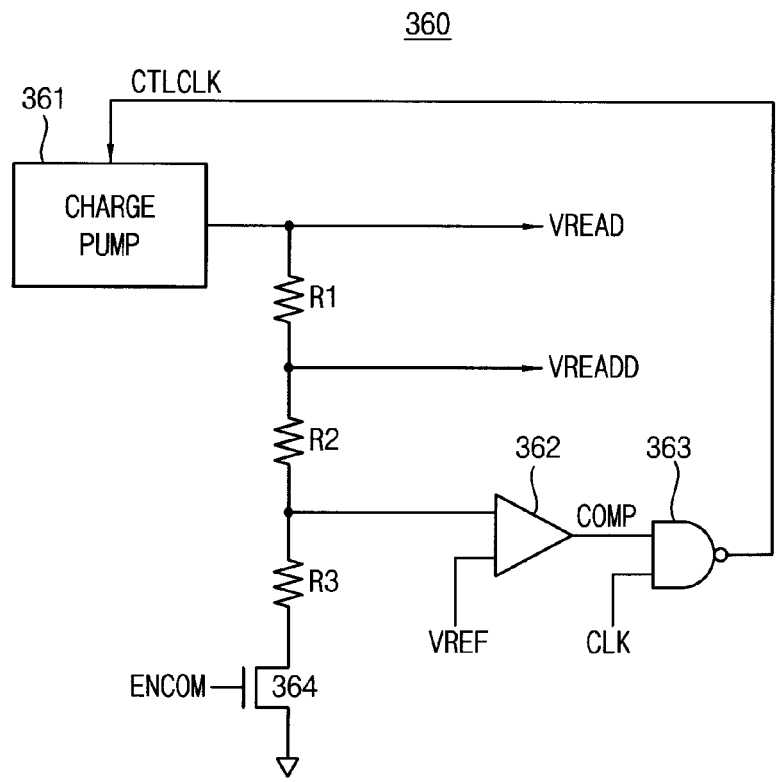
FIG. 7 is a circuit diagram illustrating an example of a second voltage generating unit of FIG. 6.

FIG. 7 illustrates an example of second voltage generating unit 360 of FIG. 6. In the example of FIG. 7, second voltage generating unit 360 comprises a charge pump 361, a comparator 362, and a logical operating unit 363.

Charge pump 363 generates read-out voltage VREAD and dummy read-out voltage VREADD based on a control clock signal CTLCLK. Dummy read-out voltage VREADD is generated by dividing read-out voltage VREAD using voltage-dividing resistors R1, R2 and R3. Comparator 362 generates a comparison signal COMP based on read-out voltage VREAD and a reference signal VREF.

Logical operating unit 363 outputs control clock signal CTLCLK to control a boosting operation of charge pump 361 based on a clock signal CLK and comparison signal COMP.

Conventional charge pumps generate high voltages by boosting supply voltages in response to clock signals. In the example of FIG. 7, comparator 362 generates comparison signal COMP with a logic level "high" when read-out voltage VREAD is lower than a target voltage and with a logic level "low" when read-out voltage VREAD is higher than the target voltage. In this example, comparator 362 comprises a NAND gate. In addition, control clock signal CTLCLK has the same logic level as clock signal CLK when read-out voltage VREAD is lower than the target voltage and remains in a logic level "low" when read-out voltage VREAD is relatively higher than the target voltage. Thus, charge pump 361 maintains the target voltage of read-out voltage VREAD in response to control clock signal CTLCLK. Whenever the target voltage of read-out voltage VREAD is maintained, a target voltage of dummy read-out voltage VREADD may be maintained.

In the example of FIG. 7, read-out voltage VREAD is divided with a division ratio that is determined by values of voltage-dividing resistors R1, R2 and R3 and is provided to comparator 362. In this case, the reference voltage VREF may have a voltage level that is determined based on a multiplication of the division ratio and the target voltage. The reference voltage VREF may be provided as a mode register set (MRS) signal. Operations of comparator 362 are controlled based on a control signal ENCOM that is provided to a gate of a transistor 364 that is connected between voltage-dividing resistor R3 and ground.

Figure 8:
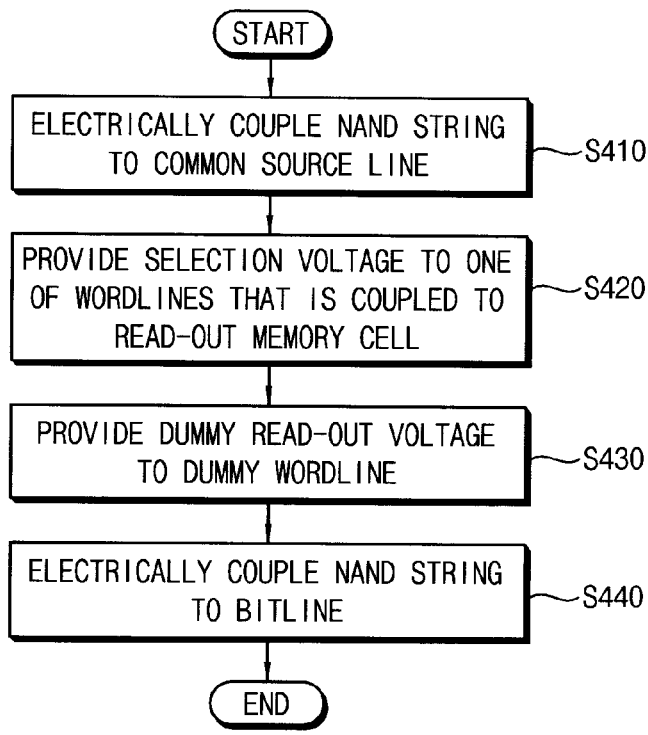
FIG. 8 is a flow chart illustrating a method of reading data from a nonvolatile memory device according to an embodiment of the inventive concept.

FIG. 8 is a flow chart illustrating a method of reading data of a nonvolatile memory device according to an embodiment of the inventive concept.

Referring to FIGS. 1, 2A, 4 and 8, NAND strings 111 and 112 are electrically coupled to a common source line CSL (S410). NAND string 111 comprises first dummy cell DMC11, second dummy cell DMC21, memory cells MC11 through MCm1 that are coupled in series between string selection transistor SST1 and ground selection transistor GST1 through first dummy memory cell DMC11, and second dummy memory cell DMC21. NAND string 112 comprises first dummy cell DMC12, second dummy cell DMC22, memory cells MC12 through MCm2 that are coupled in series between string selection transistor SST2 and ground selection transistor GST2 through first dummy memory cell DMC12 and second dummy memory cell DMC22.

Selection signal VSEL is provided to one of wordlines WL1 through WLm that is coupled to a selected memory cell, based on a row address signal ADDX (S420). Dummy read-out voltage VREADD is provided to first dummy wordline DWL1 and second dummy wordline DWL2 (S430). The level or magnitude of dummy read-out voltage VREADD is lower than the level of read-out voltage VREAD. NAND strings 111 and 112 are electrically coupled to bitlines BL1 and BL2 based on a string selection voltage (S440). In particular, NAND strings 111 and 112 are electrically coupled to bitlines BL1 and BL2 when read-out voltage VREAD is provided to string selection line SSL.

Figure 9:
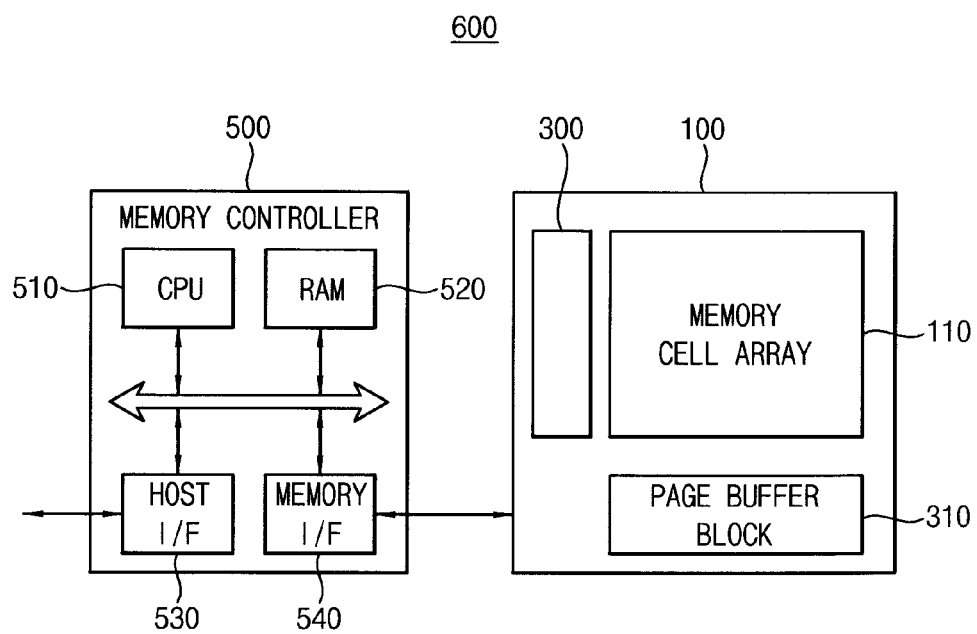
FIG. 9 is a block diagram illustrating an example of a nonvolatile memory system incorporating the nonvolatile memory device of FIG. 1.

FIG. 9 is a block diagram illustrating an example of a nonvolatile memory system incorporating nonvolatile memory device 100 of FIG. 1.

Referring to FIG. 9, a nonvolatile memory system 600 comprises a nonvolatile memory device 100 and a memory controller 500.

Nonvolatile memory device 100 comprises a memory cell array 110, a page buffer block 310, and a voltage generator 300. Page buffer block 310 is coupled to bitlines of memory cell array 110 and comprises page buffers for temporarily storing data. Memory cell array 110 comprises a first dummy memory cell, a second dummy memory cell, and a NAND string comprising a plurality of memory cells coupled in series between a string selection transistor and a ground selection transistor through the first and second dummy memory cells. During the read-out operation mode, a dummy read-out voltage that is lower than a read-out voltage is provided to dummy wordlines coupled to the dummy memory cells while the read-out voltage is provided to unselected wordlines coupled to unselected memory cells. The read-out voltage and the dummy read-out voltage are generated by voltage generator 300.

Memory controller 500 controls nonvolatile memory device 100. For instance, memory controller 500 controls data transfer operations between nonvolatile memory device 100 and an external host. Memory controller 500 comprises a central processing unit (CPU) 510, a buffer memory (e.g., a random access memory) 520, a host interface 530 and a memory interface 540. Central processing unit 510 operates to perform the data transfer operation. Host interface 530 is coupled to the outside host, and memory interface 540 is coupled to nonvolatile memory device 100. Central processing unit 510 communicates with the outside host through host interface 530. Central processing unit 510 controls nonvolatile memory device 100 through memory interface 540.

Buffer memory 520 temporarily stores data that is provided by the external host or read from nonvolatile memory device 100.

In certain embodiments, memory controller 500 further comprises a nonvolatile memory device that stores start-up codes, or an error correction (ECC) block for detecting and reducing errors. Buffer memory 520 can comprise, for instance, a dynamic random access memory (DRAM), a static random access memory (SRAM), a phase-change random access memory (PRAM), a ferroelectric random access memory (FRAM), a resistive random access memory (RRAM), or a magnetic random access memory (MRAM). Buffer memory 520 serves as a working memory of central processing unit 510.

Nonvolatile memory system 600 can comprise a memory card or a solid state drive/disk (SSD). Memory controller 500 can be configured to communicate with the external host using interfaces such as universal serial bus (USB), multimedia card (MMC) interface, advance technology attachment (ATA), serial-ATA, parallel-ATA, small computer system interface (SCSI), enhanced small disk interface (ESDI), integrated drive electronics (IDE), etc.

Nonvolatile memory device 100 and/or memory controller 500 can be mounted together in various types of packages. For example, nonvolatile memory device 100 and/or memory controller 500 can be mounted in a package having a configuration such as package on package (PoP), ball grid array (BGA), chip scale packages (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc.

Figure 10:
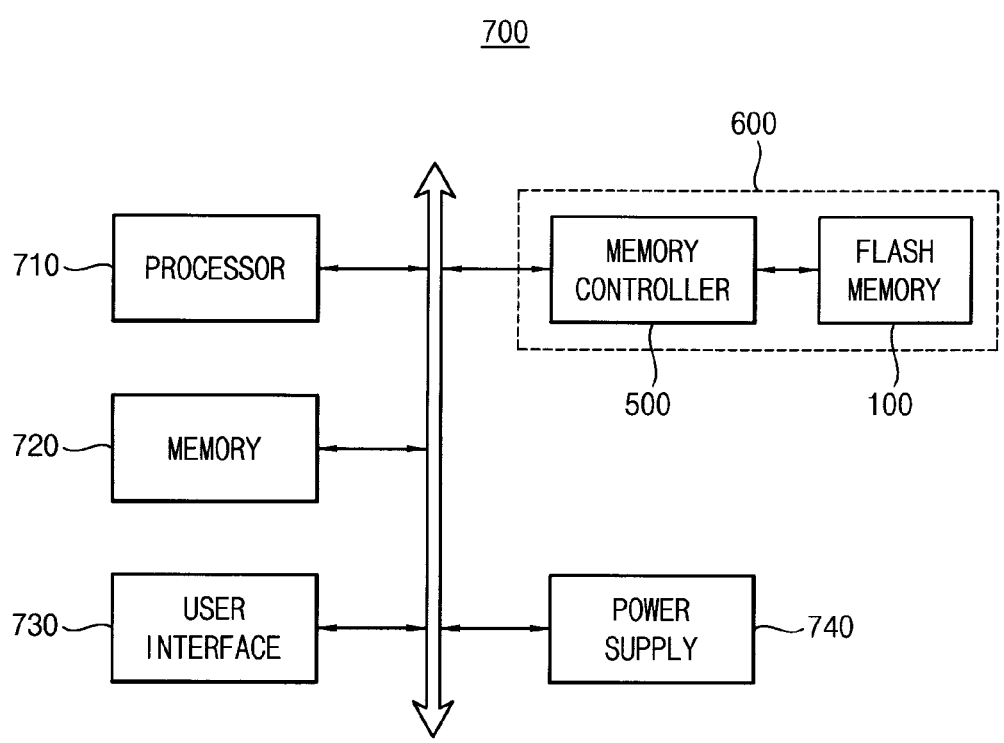
FIG. 10 is a block diagram illustrating an example of a computing system incorporating the nonvolatile memory system of FIG. 9.

FIG. 10 is a block diagram illustrating an example of a computing system incorporating nonvolatile memory system 600 of FIG. 9.

Referring to FIG. 10, a computing system 700 comprises a processor 710, a memory device 720, a user interface 730, and nonvolatile memory system 600.

Processor 710 performs various computing functions such as calculating functions and functions for operating software for various tasks. For example, processor 710 can be a microprocessor or a central computing unit. Processor 710 is coupled to memory device 720 through address buses, control buses and/or data buses. For example, memory device 720 may be one of various volatile or nonvolatile memory devices, such as a dynamic random access memory, a static random access memory (SRAM), an erasable programmable read-only memory, an EEPROM and/or a flash memory.

Processor 710 can be coupled to an extension bus such as Peripheral Component Interconnect (PCI) bus. As such, processor 710 can control user interface 730, which comprises at least one input device (e.g., a keyboard or mouse) and/or at least one output device (e.g., a printer or a display device).

Data provided through user interface 730 or processed by processor 710 can be stored in nonvolatile memory system 600 through memory controller 500. Computing system 700 further comprises a power supply 740 for supplying operating voltages. Additionally, computing system 700 further comprises an application chipset, a camera image processor (CIS), a mobile DRAM, etc.

Computing system 700 can comprise any of several types of electronic devices, such as a cellular phone, a personal digital assistant (PDA), a digital camera, a portable game console, a MP3 player, a desktop computer, a laptop (or a notebook computer), a video player, a television, and many others.

As indicated by the foregoing, nonvolatile memory devices, nonvolatile memory systems and methods of reading data in nonvolatile memory devices according to example embodiments can provide dummy memory cells with dummy read-out voltages that are lower than read-out voltages provided to unselected memory cells. By doing so, these devices, systems and methods can improve efficiency of read-out operations by reducing floating gate coupling of wordlines that are near the dummy memory cells.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A nonvolatile memory device comprising:
a memory cell array comprising at least one dummy memory cell connected to at least one dummy wordline, a NAND string comprising a plurality of memory cells connected in series between a string selection transistor and a ground selection transistor through the at least one dummy memory cell, a plurality of wordlines connected to the plurality of memory cells, a string selection line connected to the string selection transistor, and a ground selection line connected to the ground selection transistor;
a row selection circuit coupled to the memory cell array through the string selection line, the ground selection line and the plurality of wordlines, and configured to provide wordline voltages to the plurality of wordlines based on address signals; and
a voltage generator configured to generate the wordline voltages;
wherein, during a read-out operation mode of the nonvolatile memory device, a dummy read-out voltage is applied to the at least one dummy wordline, a read-out voltage is applied to unselected wordlines connected to unselected memory cells in the NAND string and a selection voltage is applied to a selected wordline connected to a selected memory cell to be read out, the dummy read-out voltages having a first voltage level and the read-out voltage having a second voltage level greater than the first voltage level, the selection voltage being lower than the read-out voltage.

2. The nonvolatile memory device of claim 1, wherein the first voltage level is a voltage level capable of reducing floating gate coupling on a wordline adjacent to the at least one dummy wordline due to a shift in a threshold voltage of the at least one dummy memory cell.

3. The nonvolatile memory device of claim 1, wherein the first voltage level is within a range of about 5 to 6 volts and the second voltage level is within a range of about 7 to 7.5 volts.

4. The nonvolatile memory device of claim 2, wherein the threshold voltage of the at least one dummy memory cell is lower than the dummy read-out voltage.

5. The nonvolatile memory device of claim 1, wherein the at least one dummy memory cell is coupled between the string selection transistor and the plurality of memory cells.

6. The nonvolatile memory device of claim 1, wherein the at least one dummy memory cell is coupled between the plurality of memory cells and the ground selection transistor.

7. The nonvolatile memory device of claim 1, wherein the dummy read-out voltage is higher than the selection voltage.

8. The nonvolatile memory device of claim 1, wherein the dummy read-out voltage is lower than the selection voltage.

9. A non-volatile memory device comprising:
a memory cell array comprising a NAND string comprising a plurality of memory cells and at least one dummy memory cell connected in series between a string selection transistor and a ground selection transistor through a plurality of wordlines connected to the plurality of memory cells, a string selection line connected to the string selection transistor, and a ground selection line connected to the ground selection transistor, the at least one dummy memory cell being between some of the plurality of memory cells and the string selection transistor and being connected to at least one dummy wordline between some of the plurality of wordlines and the string selection line;
a row selection circuit coupled to the memory cell array through the string selection line, the ground selection line and the plurality of wordlines, and configured to provide wordline voltages to the plurality of wordlines based on address signals; and
a voltage generator configured to generate the wordline voltages;
wherein, during a read-out operation mode of the nonvolatile memory device, a dummy read-out voltage is applied to the at least one dummy wordline, a read-out voltage is applied to unselected wordlines connected to unselected memory cells in the NAND string, and a selection voltage is applied to a selected wordline connected to a selected memory cell to be read out, the dummy read-out voltage having a first voltage level and the read-out voltage having a second voltage level greater than the first voltage level, the selection voltage being lower than the read-out voltage.

10. The nonvolatile memory device of claim 9, wherein the at least one dummy memory cell is in an erased state before the dummy read-out voltage is provided to the at least one dummy wordline.

11. The nonvolatile memory device of claim 9, wherein the threshold voltage of the at least one dummy memory cell is lower than the dummy read-out voltage.

12. The nonvolatile memory device of claim 9, wherein the dummy read-out voltage is higher than the selection voltage.

13. The nonvolatile memory device of claim 9, wherein the dummy read-out voltage is lower than the selection voltage.

14. A method of reading data in a non-volatile memory device including a NAND string comprising a plurality of memory cells and at least one dummy memory cell connected in series between a string selection transistor and a ground selection transistor through a plurality of wordlines connected to the plurality of memory cells, a string selection line connected to the string selection transistor, and a ground selection line connected to the ground selection transistor, the method comprising:
electrically coupling the NAND string to a common source line;
applying a selection voltage to selected wordline which is connected to a selected memory cell in the NAND string and is selected in response to a row address signal;
applying a dummy read-out voltage to at least one dummy wordline connected to the at least one dummy memory cell;
applying a read-out voltage to unselected wordlines connected to unselected memory cells in the NAND string; and
electrically coupling the NAND string to a bitline, wherein the dummy read-out voltage having a first voltage level, the read-out voltage having a second voltage level greater than the first voltage level and the selection voltage is lower than the read-out voltage.

15. The method of claim 14, wherein the at least one dummy memory cell is coupled between the string selection transistor and the plurality of memory cells.

16. The method of claim 14, wherein the at least one dummy memory cell is coupled between the plurality of memory cells and the ground selection transistor.

17. The method of claim 14, wherein at least one dummy memory cell is coupled among the plurality of memory cells.

18. A solid state drive (SSD) comprising:
a plurality of nonvolatile memory devices; and
a memory controller configured to control the plurality of nonvolatile memory devices, each of the plurality of nonvolatile memory devices comprising:
a memory cell array comprising a NAND string comprising a plurality of memory cells and at least one dummy memory cell connected in series between a string selection transistor and a ground selection transistor through a plurality of wordlines connected to the plurality of memory cells, a string selection line connected to the string selection transistor, and a ground selection line connected to the ground selection transistor, the at least one dummy memory cell being between some of the plurality of memory cells and the string selection transistor and being connected to at least one dummy wordline between some of the plurality of wordlines and the string selection line;
a row selection circuit coupled to the memory cell array through the string selection line, the ground selection line and the plurality of wordlines, and configured to provide wordline voltages to the plurality of wordlines based on address signals; and
a voltage generator configured to generate the wordline voltages;
wherein, during a read-out operation mode of the nonvolatile memory device, a dummy read-out voltage is applied to the at least one dummy wordline, a read-out voltage is applied to unselected wordlines connected to unselected memory cells in the NAND string, and a selection voltage is applied to a selected wordline connected to a selected memory cell to be read out, the dummy read-out voltage having a first voltage level and the read-out voltage having a second voltage level greater than the first voltage level, the selection voltage being lower than the read-out voltage.

19. A memory card comprising:
at least one nonvolatile memory device; and a memory controller configured to control the at least one nonvolatile memory device, the at least one nonvolatile memory device comprising:

a memory cell array comprising a NAND string comprising a plurality of memory cells and at least one dummy memory cell connected in series between a string selection transistor and a ground selection transistor through a plurality of wordlines connected to the plurality of memory cells, a string selection line connected to the string selection transistor, and a ground selection line connected to the ground selection transistor, the at least one dummy memory cell being between some of the plurality of memory cells and the string selection transistor and being connected to at least one dummy wordline between some of the plurality of wordlines and the string selection line;

a row selection circuit coupled to the memory cell array through the string selection line, the ground selection line and the plurality of wordlines, and configured to provide wordline voltages to the plurality of wordlines based on address signals; and a voltage generator configured to generate the wordline voltages;

wherein, during a read-out operation mode of the nonvolatile memory device, a dummy read-out voltage is applied to the at least one dummy wordline, a read-out voltage is applied to unselected wordlines connected to unselected memory cells in the NAND string, and a selection voltage is applied to a selected wordline connected to a selected memory cell to be read out, the dummy read-out voltage having a first voltage level and the read-out voltage having a second voltage level greater than the first voltage level, the selection voltage being lower than the read-out voltage.

* * * * *